United States Patent [19]
Ohori

[11] Patent Number: 5,399,522
[45] Date of Patent: Mar. 21, 1995

[54] METHOD OF GROWING COMPOUND SEMICONDUCTOR

[75] Inventor: Tatsuya Ohori, Kawasaki, Japan

[73] Assignee: Fujitsu Limited, Kawasaki, Japan

[21] Appl. No.: 117,944

[22] Filed: Sep. 8, 1993

[30] Foreign Application Priority Data

Feb. 16, 1993 [JP] Japan .................. 5-050026

[51] Int. Cl.⁶ .......................................... H01L 21/20
[52] U.S. Cl. ..................... 437/133; 105/126; 105/132
[58] Field of Search .............. 437/126, 132, 133, 105

[56] References Cited

U.S. PATENT DOCUMENTS

| 4,008,106 | 2/1977 | Gutierrez et al. | 437/3 |
| 4,174,422 | 11/1979 | Mattews | 437/133 |
| 4,965,224 | 10/1990 | Horikawa et al. | 437/132 |

FOREIGN PATENT DOCUMENTS 0413546  2/1991  European Pat. Off. .
89/04551 5/1989  WIPO .

OTHER PUBLICATIONS

Haruo et al., "Manufacture of Group III–V Compound Semiconductor", *Patent Abstracts of Japan*, vol. 008, No. 200 (E-266), Sep. 13, 1984 & JP-A-59 087814 (Hitachi Seisakusho KK) May 21, 1994.

*Primary Examiner*—R. Bruce Breneman
*Assistant Examiner*—Ramamohan Rao Paladugu
*Attorney, Agent, or Firm*—Staas & Halsey

[57] ABSTRACT

A first monocrystalline group III-V compound semiconductor layer is formed on an Si substrate. The surface of the first monocrystalline group III-V compound semiconductor layer is polished. A second monocrystalline group III-V compound semiconductor layer is grown on the polished surface by a metal organic chemical vapor deposition, by using as a group III source material at least partially a source material of group III atoms bonded to ethyl radical at the initial stage of growth, and thereafter by using as the group III source material a source material of group III atoms bonded to methyl radical. A grown layer with a flat surface can be obtained. The surface flatness can be improved further by adding In as a group III element.

16 Claims, 8 Drawing Sheets

METHOD OF GROWING COMPOUND SEMICONDUCTOR

BACKGROUND OF THE INVENTION a) Field of the Invention

The present invention relates to a crystal growth technique, and more particularly to a method of growing group III-V compound semiconductor crystal on an Si substrate.

b) Description of the Related Art

Group III-V compound semiconductor devices have been developed for use as optoelectronic devices, high speed devices, and the like. Semiinsulating GaAs or InP substrates are often used as the substrates of group III-V compound semiconductor devices. Although such substrates physically support semiconductor devices, they have no electrical function other than as an electrical insulating element.

Group III-V compound semiconductor substrates such as GaAs substrates are more expensive and brittle and fragile than Si substrates, requiring much care in handling them. Si substrates are generally superior to compound semiconductor substrates in that the former is light in weight (less dense), high in thermal conductivity, low in price, high in mechanical strength, easy to make a large diameter wafer, and so on, except that it has a low electron mobility.

In order for compound semiconductor devices to positively use such advantages of Si substrates, techniques regarding GaAs on an Si substrate (GaAs on Si), for example, have drawn attention. However, the coefficient of thermal expansion of GaAs is about three times as that of Si, and GaAs has a zinc blend structure whose crystal system is different from the diamond structure of Si. Because of these different points, the technique regarding a GaAs crystal on an Si substrate has many problems to be solved.

When a GaAs layer is grown on an Si substrate at a temperature of about 600° to 700° C. and thereafter cooled to the room temperature, a large thermal stress will be generated because of a difference between the coefficients of thermal expansion. This thermal stress generates lattice defects in the GaAs crystal. The density of lattice defects reaches sometimes to $10^6$ to $10^9 cm^{-2}$ although it depends on the growth process. These lattice defects deteriorate the properties of manufactured semiconductor devices.

GaAs contracts greater than Si when the temperature is lowered from the growth temperature to the room temperature, so that the GaAs/Si (GaAs on Si) substrate warps upward. As the upward warpage of a wafer becomes greater, the diameter of the substrate becomes larger. The warpage of a wafer degrades the exposure precision of photolithography.

The crystal growth of a GaAs layer on an Si substrate is not uniform, forming a number of irregularities on the growth surface. For example, a number of irregularities of about 2000 nm in in-plane directions and about 20 nm in height are formed on the surface of a GaAs layer having a film thickness of 3 μm.

Such a poor surface structure (poor morphology) may hinder the formation of fine semiconductor elements. In order to solve this problem, various approaches have been studied heretofore. Relevant techniques will be described briefly in the following.

[2-Step Growth Method]

This technique provides a method of growing a monocrystalline GaAs layer on an Si substrate by two steps.

An Si substrate is used which has a surface tilted by about 3 degrees from the (100) surface in the <011> direction. The Si substrate having such a surface is called hereinafter a misoriented Si substrate.

A clean Si surface is first exposed. An amorphous GaAs layer is grown on the Si surface at a low temperature of about 500° C. by an MOCVD method.

Thereafter, the amorphous GaAs layer grown at the low temperature is crystallized into a monocrystalline layer by heating it to about 600° C. On the monocrystalline GaAs layer, a desired group III-V compound semiconductor layer is grown.

[Reduction of Lattice Defects (Dislocation Densities)]

The following methods are known as a method of reducing lattice defects of a GaAs crystal layer grown on an Si substrate.

(1) Lattice defects (dislocations) to be caused by thermal stress in a GaAs layer due to a difference between the coefficients of thermal expansion, are forcibly bent and moved in the lateral direction of the GaAs layer, by raising and lowering the temperature during the growth process of the GaAs layer.

(2) A layer having a different lattice constant and generating stress in the lateral direction is inserted during the growth of a GaAs layer. For example, an InGaAs layer is used as such a layer. Dislocations generated in the GaAs layer are forcibly bent and moved in the lateral direction by the stress caused by a difference between the lattice constants.

[Improvement of Morphology]

A buffer layer is grown on a silicon substrate at a low temperature, the buffer layer being made of material having a large coupling or bonding energy to silicon, such as AlAs and AlP. Presence of such material on the surface of silicon restricts the surface diffusion (migration) of atoms attached to the surface of the buffer layer during the later process of growing compound semiconductor such as GaAs, thereby suppressing the formation of crystal islands.

In addition to the above-described methods, other approaches have been studied, including annealing after the selective growth or semiconductor crystal growth.

It is very difficult to manufacture a GaAs/Si substrate having a good morphology so far as the present inventor knows. It is very difficult for the above-described two-step growth method to stop the formation of irregularities (steps) in the order of 10 nm to 20 nm.

SUMMARY OF THE INVENTION

It is an object of the present invention to provide a method of growing group III-V compound semiconductor crystal on an Si substrate, capable of improving morphology.

According to one aspect of the present invention, there is provided a method of growing compound semiconductor crystal which method includes a first growth step of growing a first monocrystalline group III-V compound semiconductor layer on an Si substrate, a step of polishing the first monocrystalline group III-V compound semiconductor layer to obtain a polished surface, and a second growth step of growing a second monocrystalline group III-V compound semiconductor layer on the polished surface by a metal organic chemical vapor deposition method, by using as a group III source material at least partially a source material of group III atoms bonded to ethyl radical at the initial stage of the second growth step, and thereafter by using as the group III source material a source material of group III atoms bonded to methyl radical.

If the surface of a monocrystalline group III-V compound semiconductor layer grown on an Si substrate is polished, the surface can be made flat to some degree.

However, the polished surface is not flat from the viewpoint of crystallography, but it contains a number of dislocations.

On the polished surface containing dislocations, a monocrystalline group III-V compound semiconductor layer is grown by using at least partially source material of group III atoms bonded to ethyl radical. This monocrystalline layer has excellent surface morphology.

A metal organic chemical vapor deposition (MOCVD) method using the source material of group III atoms bonded to ethyl radical has a low growth speed, decomposed components being likely to be deposited on a reaction furnace. It is therefore difficult to grow a relatively thick monocrystalline layer by using only the source material of group III atoms bonded to ethyl radical.

However, if source material of group III atoms bonded to methyl radical replaces the ethyl-based source material or if a mixed gas of ethyl- and methyl-based source materials is used, a monocrystalline group III-V compound semiconductor layer having a desired thickness can be grown with good surface morphology.

As described above, there is provided a method of growing group III-V compound semiconductor crystal with good morphology on an Si substrate.

DETAILED DESCRIPTION OF THE PREFERRED EMBODIMENTS

The embodiments of the present invention will be described in connection with the experiments based on which the invention has been made.

FIGS. 1A to 1G are cross sectional views explaining how a GaAs/Si substrate having a polished surface is formed. There is first prepared a misoriented (100) Si substrate having a surface tilted by about 3 degrees from the (100) surface in the <011> direction.

Figure 1A:
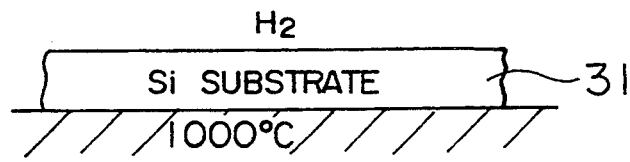
FIGS. 1A to 1G are schematic cross sections explaining a method of forming a GaAs/Si substrate with a polished surface.

As shown in FIG. 1A, a misoriented Si substrate 31 is heated up to about 1000° C. in a hydrogen atmosphere. The $SiO_2$ layer on the surface of the Si substrate 31 is reduced by hydrogen and removed from the surface.

Figure 1B:
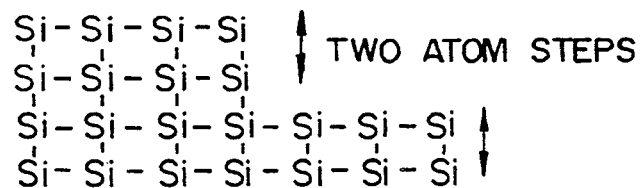

As schematically shown in FIG. 1B, the surface of the Si substrate with the $SiO_2$ layer removed is of a step-formed structure having steps each with a height of two atom layers. Because each step has a height corresponding to two atom layers, the GaAs layers grown on these stepped surfaces from continuous atom layers of the same group III or V element, even above these steps.

Next, the Si substrate 31 is heated up to about 500° C. and a low temperature GaAs layer is grown on the surface of the misoriented Si substrate 31 by a metal organic chemical vapor deposition (MOCVD) method.

Figure 1C:
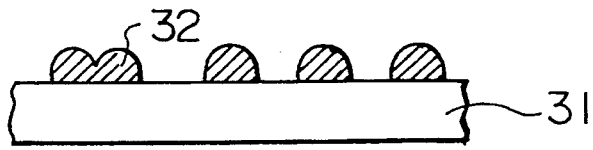
Figure 1D:
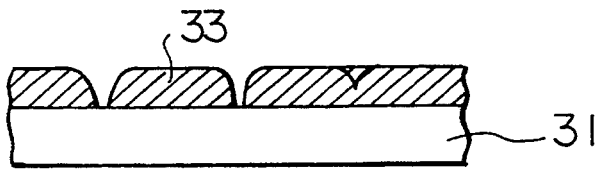

At this process, as shown in FIG. 1C, island regions 32 of amorphous GaAs are first grown on the misoriented Si substrate 31. Adjacent GaAs island regions 32 are gradually combined to form an amorphous GaAs layer 33 covering the surface of the misoriented Si substrate as shown in FIG. 1D.

Figure 1E:
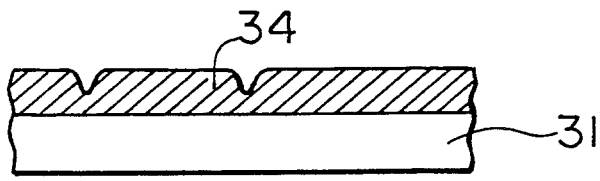

The growth of the GaAs layer is temporarily intercepted to heat the misoriented Si substrate 31 up to a usual growth temperature of about 600° C. This heating process crystallizes the low temperature GaAs buffer layer 33 and forms a first GaAs monocrystalline buffer layer 34 as shown in FIG. 1E.

Figure 1F:
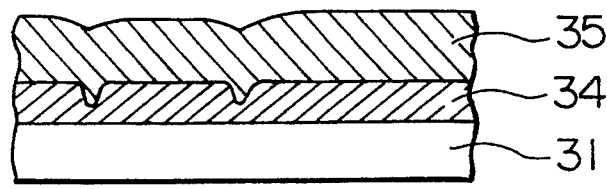

Thereafter, as shown in FIG. 1F, a second GaAs buffer layer 35 is epitaxially grown on the first GaAs buffer layer 34 by an MOCVD method. The processes up to this process correspond to the conventional two-step growth method.

Figure 1G:
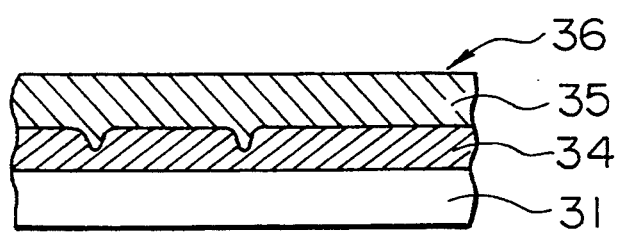

Next, as shown in FIG. 1G, the surface of the second GaAs buffer layer 35 is polished with a buff to form a polished flat surface 36, while applying solution of sodium carbonate hypochlorite to the surface. With this process, the monocrystalline GaAs layer having an apparently flat surface is obtained.

The present inventor has inquired into various methods of growing an epitaxial layer having excellent morphology on a GaAs/Si substrate having the surface polished as described above, and has investigated various source gases. It has been found from experiments that the surface morphology of re-grown crystal changes greatly with the selection of source gasses.

The details and results of the experiments will be explained. As a GaAs/Si substrate having a polished surface, there was prepared a GaAs layer having a thickness of about 1 μm. On the polished surface, there was grown a GaAs layer having a thickness of 0.6 to 0.7 μm at the growth pressure of about 76 Torr, under the following four conditions. The regrown layer thickness was set to 0.6 to 0.7 μm which is the standard film thickness of crystal used for high electron mobility transistors (HEMT).

(1) Trimethylgallium (TMGa)
(2) Triethylgallium (TEGa)
(3) TEGa for first 50 nm and TMGa for remaining 0.65 μm
(4) Mixed gas of TMGa and TEGa (flow rate: TMGa/TEGa=0.7/0.3)

Under the first and second conditions (1) and (2), the growth temperature was changed within the range from 600° to 720° C., and the flow rate was set so that it achieved the growth speed of 8 to 10 angstroms/second. The flow rate of groups V/III was set to about 20. Under the first condition (1), experiments were also conducted by changing the V/III ratio within the range from 10 to 50, and by setting the growth pressure to 760 Torr.

Figure 3:
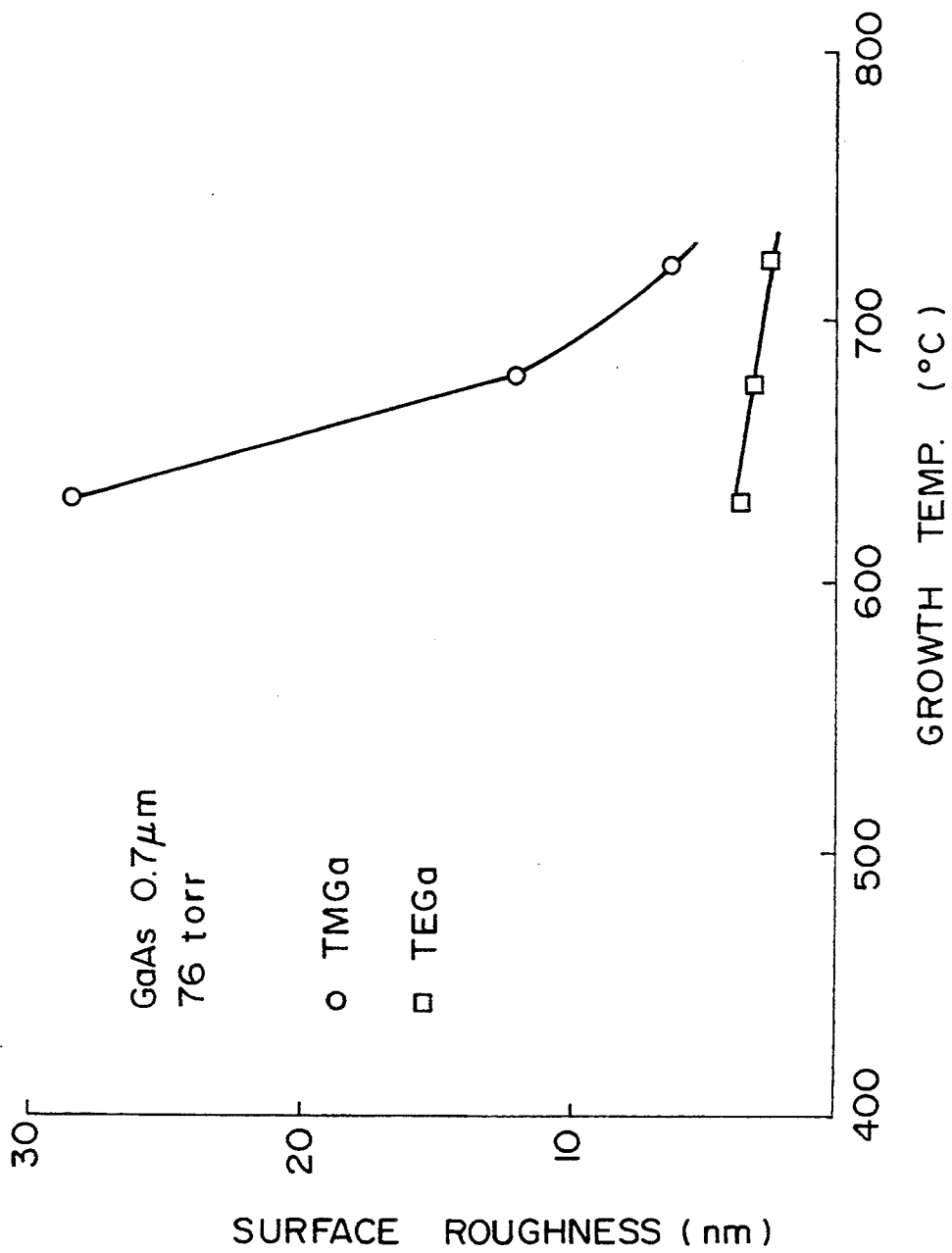
FIG. 3 is a graph showing the surface roughness relative to the growth temperature, when TMGa and TEGa are used as group III source gasses.

FIG. 3 is a graph showing the dependency of surface roughness on the growth temperature, obtained from the experiments under the conditions (1) and (2). In the film growth process using TMGa as the Ga source, the surface roughness was as large as 30 nm at the growth temperature of about 630° C., and reduced as the growth temperature was raised. However, even at the growth temperature of about 720° C., the surface roughness was about 6.5 nm.

In contrast, in the film growth process using TEGa as the Ga source, the surface roughness was about 3.8 nm at the growth temperature of about 680° C. and about 2.6 nm at the growth temperature of about 720° C. From these experiments, it was found that TEGa as the GA source greatly reduced the surface roughness and the growth temperature dependency.

Source material of group III atoms bonded to methyl has a high decomposition temperature, such as TMGa whose decomposition temperature is about 680° C. It is supposed that such source material reaches the substrate surface in the form of $Ga(CH_3)_3$, and is decomposed into $GaCH_3$ and methyl radical while it diffuses on the surface of the GaAs layer, to grow a crystal layer.

In contrast, source material of group III atoms bonded to ethyl radical has a weak bonding strength, such as TEGa whose decomposition temperature is about 500° C. Therefore, such source material may easily completely decomposes at about 500° C., and reaches the GaAs surface in the form of Ga atoms.

From the experiment results shown in FIG. 3, it is conceivable that source material reaching the GaAs surface in the form of Ga atoms is more effective for the improvement of surface morphology. From this conception, a molecular beam epitaxy growth was examined using Ga atoms as the Ga source.

If the surface morphology were improved by the arrival of source material in the form of Ga atoms to the GaAs surface, the MBE growth could obtain an epitaxial layer having excellent morphology.

Figure 4A:
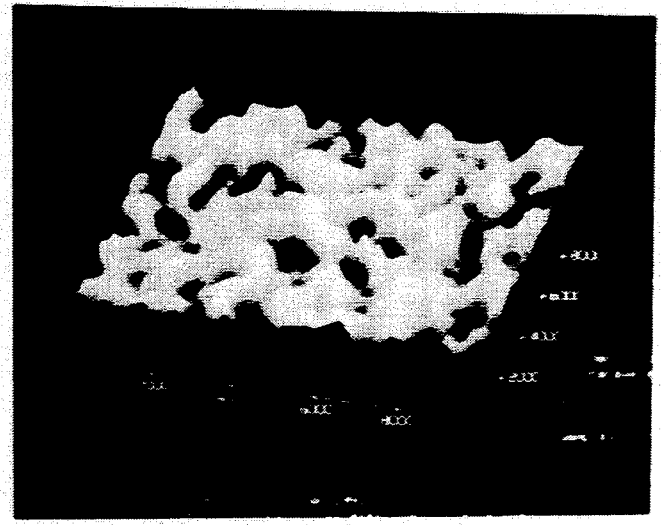
FIGS. 4A and 4B are microscopic photographs showing the crystal surface morphology grown by MBE and by MOCVD of TMGa.

On a GaAs/Si substrate having a polished surface, there was grown a GaAs layer having a thickness of 0.6 μm at the growth temperature of 650° C. by MBE. The result was a very rough surface as shown by a photograph of FIG. 4A. FIG. 4C shows the distribution of heights of the crystal surface. The surface roughness was as great as about 50 nm, and the surface morphology became worse.

The surface roughness was not improved by simply using Ga atoms as the diffusion species. It can be determined that a difference between material sources of group V elements give some effects on the surface roughness (or flatness), such as in the case of a difference between $AsH_3$ of the group V source used by MOCVD and As used by MBE.

Figure 4B:
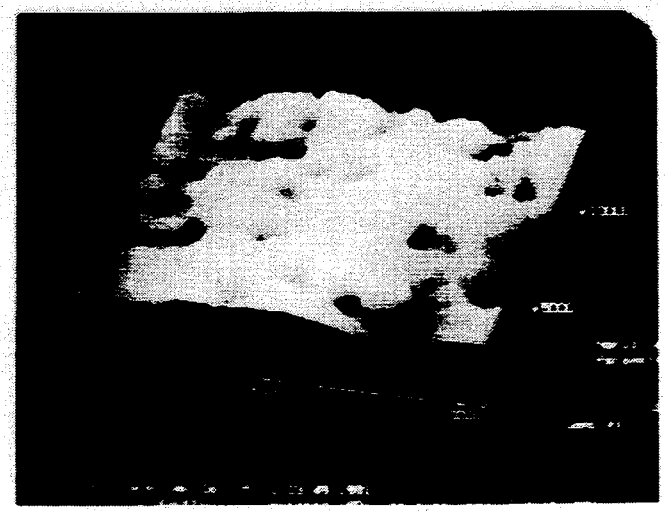
Figure 4C:
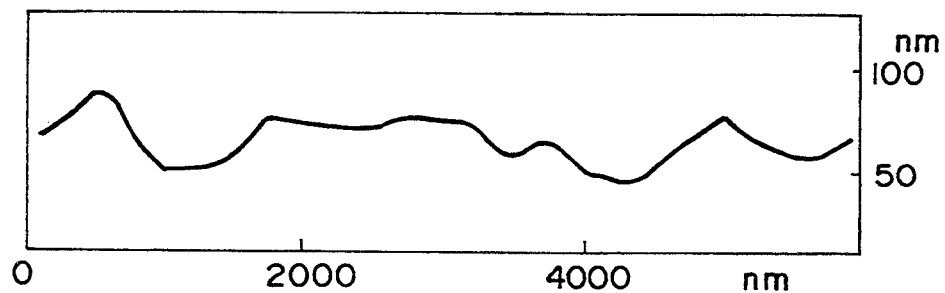
FIG. 4C is a diagram showing thickness distribution in the grown surface of FIG. 4A.

The surface of the GaAs layer grown by MOCVD using TMGa as the Ga source under the condition (1) was as shown in a photograph of FIG. 4B. As shown, deep pits were formed on the surface of the grown layer by using TMGa as the Ga source.

It was also found, from the experimental results at the normal pressure and lower pressure (78 Torr) under the condition (1), that the surface roughness of deep pits such as shown in the photograph of FIG. 4B was present at the low pressure, and the surface roughness of high projections was present at the normal pressure. It can be supposed from these results that the growth pressure affects the decomposition species on the substrate surface.

Although the details of such phenomena are not still clear, it can be said from the experiments that the surface roughness can be alleviated by using TEGa as the Ga source under a low pressure MOCVD. Other growth conditions, V/III ratios, and growth speeds did not show a distinctive temperature dependency.

In spite of the above findings, the following problems arise when growing group III-V compound semiconductor crystal on the polished surface by using source material of group III elements bonded to ethyl radical.

(a) The vapor pressure of ethyl-based source material is generally so low that a large mole flow is not available, resulting in a low growth speed in the order of 1 to 2 angstroms/second. Accordingly, it takes a long time to grow a thick layer, lowering the throughput.

Figure 5:
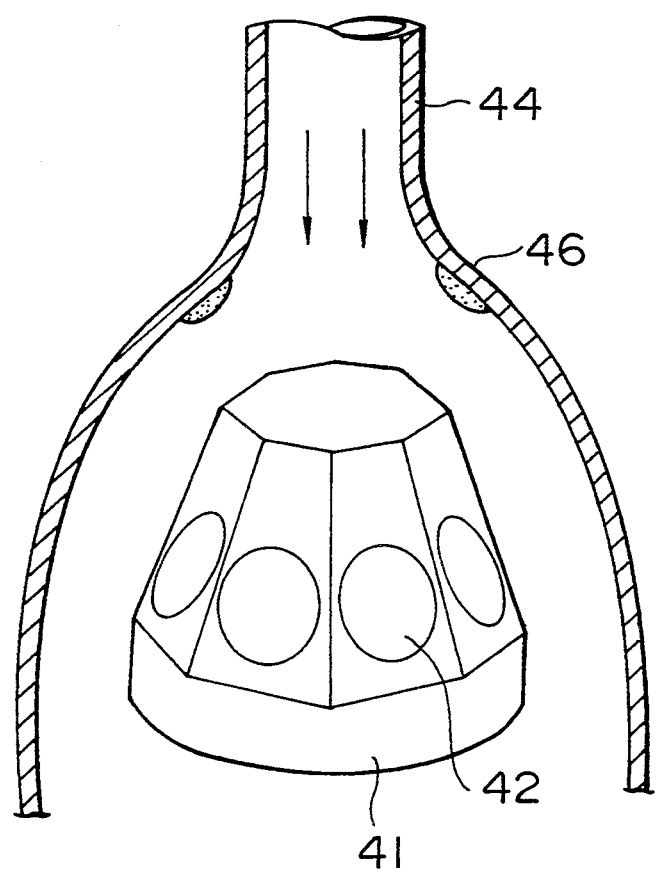
FIG. 5 is a schematic and perspective diagram showing a barrel type growth furnace.

(b) As described above, ethyl-based source material is easy to be decomposed and the decomposed components are likely to be attached to the wall of a reaction furnace. In mass production, a barrel type reaction furnace such as shown in FIG. 5 is often used. If a great amount of decomposed components are attached to the area near the inlet of source material gas and if some of them are peeled off, a number of surface defects are possibly formed in the grown layer.

In the furnace shown in FIG. 5, a susceptor 41 has a plurality of inclined surfaces around its center axis. A plurality of wafers 42 are placed on the inclined surfaces of the susceptor substrates. A source material gas inlet 44 is formed above the susceptor 41. For the crystal growth, source gas is introduced via the inlet 44 while rotating the susceptor 41.

The components of source gas such as TEGa which are easy to decompose are deposited as indicated at 46 on the surface of the furnace wall near the source gas inlet 44. As the deposited components 46 become thicker, they may be peeled off from the furnace wall and dropped on the grown layer, resulting in possible lattice defects in the layer.

From this reason, using only TEGa as the Ga source material for re-growing the entirety of the layer is practically impossible.

The present inventor has therefore examined the surface morphology obtained by using TEGa at least partially or only at the growth initial stage. This growth condition corresponds to the conditions (3) and (4).

The conditions (3) and (4) will be explained briefly with reference to FIGS. 2A to 2C.

Figure 2A:
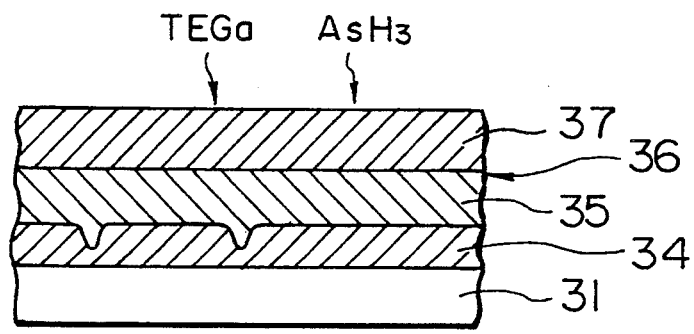
FIGS. 2A to 2C are cross sections explaining a crystal growth method of growing a group III-V compound semiconductor layer on a GaAs/Si substrate having a polished surface.
Figure 2B:
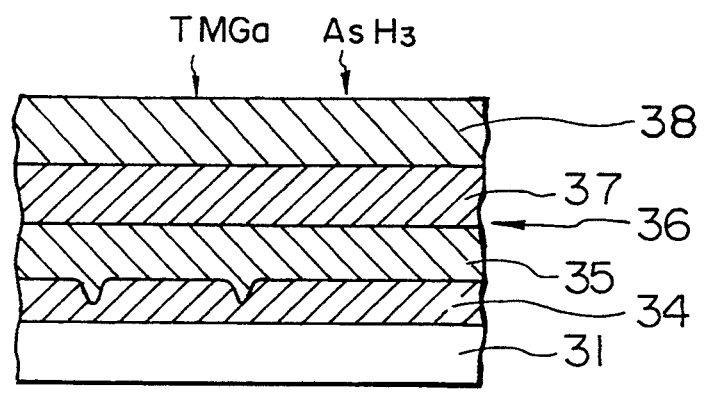

FIGS. 2A and 2B illustrate the condition (3). As shown in FIG. 2A, a GaAs layer 37 was grown by a low pressure MOCVD using TEGa as the Ga source and $AsH_3$ as the group V source material.

As shown in FIG. 2B, after the GaAs layer 37 was grown to some thickness, another GaAs layer 38 was grown by a low pressure MOCVD changing the Ga source to TMGa and using $AsH_3$ as the group V source material.

Namely, under the condition (3), the GaAs layer 37 of 50 nm was first grown using TEGa, and then the GaAs layer 38 of 0.65 μm was grown changing TEGa to TMGa.

Figure 2C:
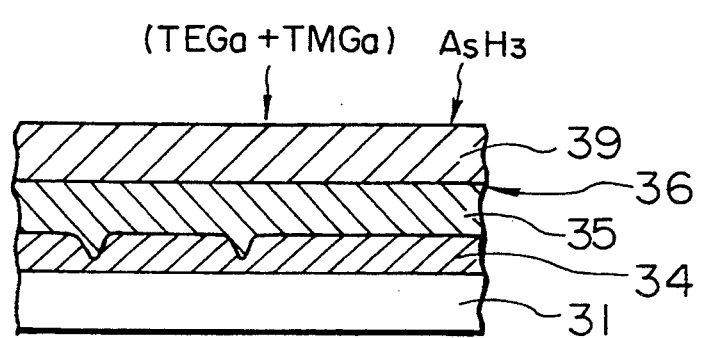

FIG. 2C illustrates the condition (4). A GaAs layer 39 was grown to about 0.6 μm by a low pressure MOCVD using both TMGa and TEGa as the Ga source and AsH$_3$ as the group V source material.

Figure 6A:
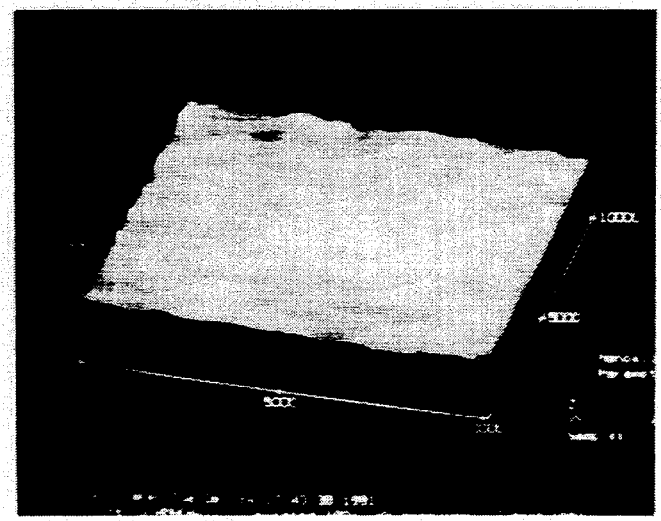
FIGS. 6A and 6B are microscopic photographs showing the crystal surface morphology grown by the embodiment method.

FIG. 6A is a microscopic photograph showing the surface morphology of the layer grown under the condition (3). As seen from this photograph, deep pits shown in the photograph of FIG. 4B were fully extinguished, presenting a smooth surface.

The morphology of dislocations in the crystals grown by TEGa and by TMGa were checked in order to identify the cause of extinguishing the pits, through transmission type electron beam microscopy measurements. There was no significant difference between them.

It can be assumed therefore that the crystal growth using TEGa has no effect of reducing dislocations. However, it is conceivable from the distinct difference between the grown surfaces that the crystal growth by TEGa can embed the disturbance of crystal to be caused by dislocations. It can be supposed that the same results will be obtained using other ethyl- and methyl-based source materials instead of TEGa and TMGa.

Although the detailed mechanism of this is presently unknown, it has been found that the surface roughness can be controlled even if a crystal layer is grown by methyl-based source material if this layer is grown on an underlie crystal layer, even if it is thin, grown by ethyl-based source material.

The experiment result under the condition (4) showed substantially the same surface as FIG. 6A. In this embodiment, a mixed gas of ethyl- and methyl-based source materials was used instead of using only the ethyl-based source material.

The minimum thickness of a film to be grown at the initial stage by ethyl-based source material is not still verified by experiments. However, from the study of other circumstances, the minimum thickness may be about 10 nm or more.

The maximum thickness of a film grown by TEGa is preferably about 100 nm or less because too thick a film results in the above-described problem in mass production.

The composition of ethyl-based source material may be 0.1 or more when considering substantially the same result of the surface morphology using the ethyl-based source material of about 0.3 instead of using only the ethyl-based source material.

An In-doped crystal layer effective for reducing a dislocation density was also checked. At the initial stage of crystal growth, a GaAs layer of about 50 nm was grown using TEGa as the Ga source.

At the next stage, an AlInGaAs layer of about 400 nm was grown on the GaAs layer at the growth temperature of about 650° C. and at the growth pressure of about 76 Torr, by using as the group III source material TMAl, TEGa, and TEIn, with the concentration of In being set to about 1E20 (1*10$^{20}$) cm$^{-3}$.

Figure 6B:
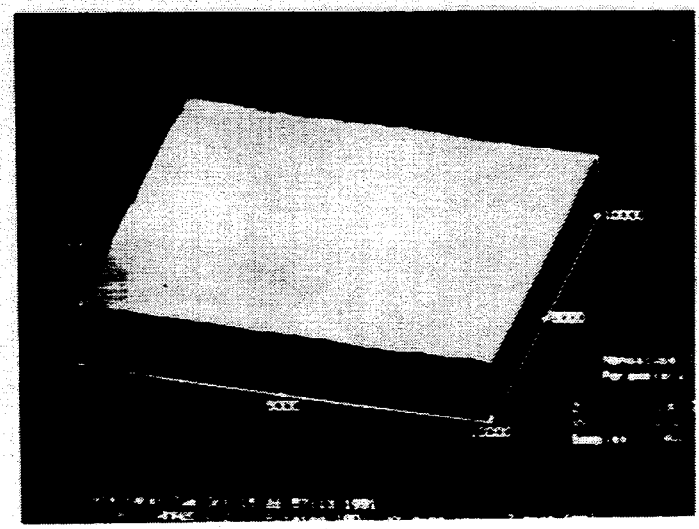

The surface morphology of the obtained crystal layer is given by a photograph of FIG. 6B. The surface morphology was improved by doping In, to the degree of the surface roughness of about 2 nm. Addition of In can improve not only the surface morphology but also the mobility, although the forbidden band gap reduces slightly.

An example of forming a group III-V compound semiconductor device using the crystal growth method described above will be briefly explained.

Figure 7:
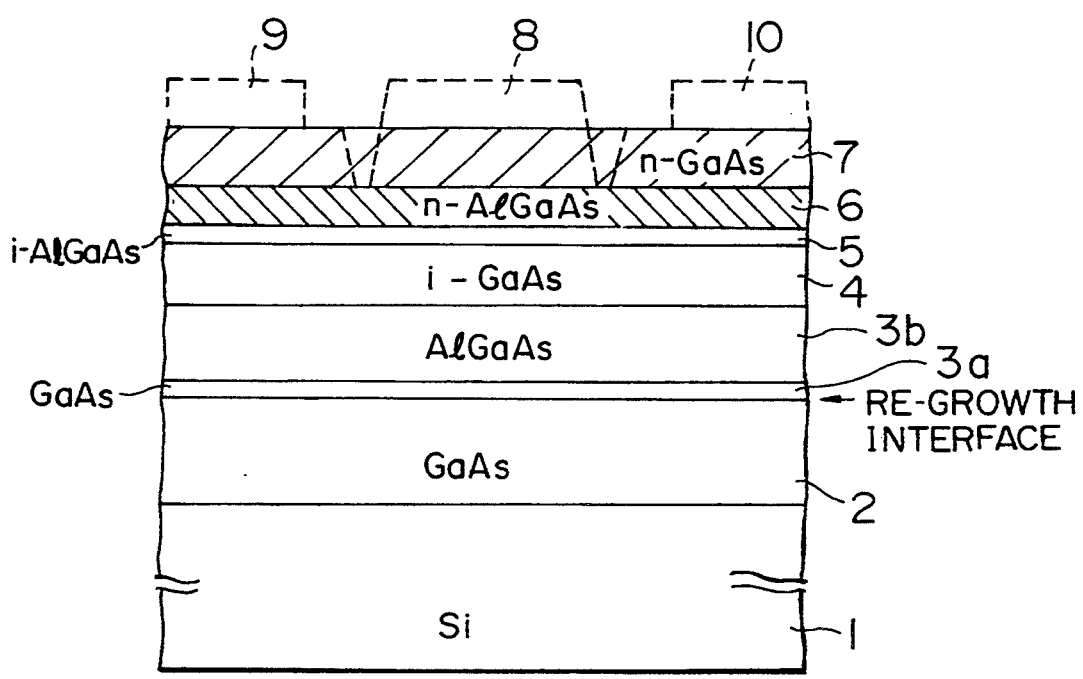
FIG. 7 is a schematic cross section showing the structure of an HEMT.

FIG. 7 is a schematic diagram showing the structure of an HEMT of group III-V compound semiconductor formed on a silicon substrate. On a GaAs/Si substrate having a polished surface, there was formed a HEMT in a laminated structure grown at the temperature of about 65° C. and at the pressure of about 76 Torr by MOCVD.

As shown in FIG. 7, a GaAs layer was grown on the surface of an Si substrate 1 by the two-step growth method. The GaAs layer 2 was polished to obtain a GaAs/Si substrate with the polished GaAs buffer layer 2 having a thickness of about 2 μm. On the polished surface of the GaAs/Si substrate, there was grown a GaAs buffer layer 3a having a thickness of about 50 nm using TEGa as the Ga source.

Next, the Ga source was switched to TMGa, and using trimethylaluminum (TMAl) as another group III source material, an AlGaAs buffer layer 3b was grown to a thickness of about 4000 nm.

On the AlGaAs buffer layer 3b, there was grown an i-type GaAs channel layer 4 having a thickness of about 200 nm using TMGa as the Ga source. The growth can be speeded up by using TMGa as the Ga source. Given a constant growth speed, the flow of source material can be reduced.

On the channel layer 4, there was grown an i-type AlGaAs spacer layer 5 having a thickness of about 1 nm by using as the Ga source TEGa and as the Al source TEAl or TMAl. On the spacer layer 5, there was grown an n-type AlGaAs layer 6 to a thickness of about 38 nm using TEGa as the Ga source, TMAl as the Al source, and Si$_2$H$_6$ as the n-type impurity source.

The reason of using TEGa as the Ga source is that the growth speed becomes slower when using TEGa than using TMGa, enabling to precisely control the thin film thickness.

Thereafter, an Si-doped n-type GaAs cap layer 7 was grown to a thickness of about 50 nm using TMGa as the Ga source and Si$_2$H$_6$ as the impurity source.

The surface roughness of the device manufactured by the above method was measured by interatomic force microscopy. The surface roughness in height was about 4 nm. This value is about one fifth (1/5) of the surface roughness of a layer grown by a conventional continuous growth method without the polishing and regrowth process. The growth time was about one half of that required when the whole of a layer is grown using only ethyl-based source material.

Thereafter, the cap layer 6 was selectively removed to form a gate electrode 8 such as aluminum. Source and drain electrodes 9 and 10 such as a laminated layer of Au—Ge/Au were formed on the surface of the cap layer 7 on both sides of the gate electrode 8. The impurity concentration of the n-type layers 6 and 7 was set to, for example, 1.5*10$^{18}$cm$^{-3}$.

Figure 8:
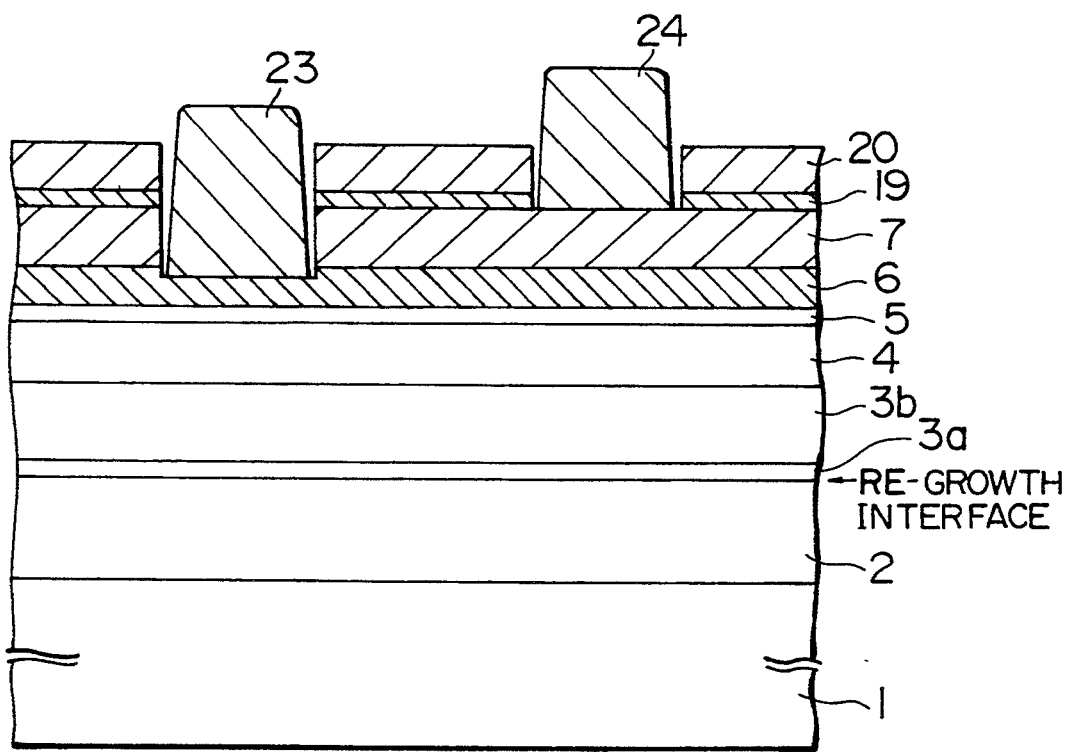
FIG. 8 is a schematic cross section showing the structure of an E mode/D mode HEMT.

FIG. 8 shows the structure of a group III-V compound semiconductor device integrating an enhancement (E) mode HEMT and a depletion (D) mode HEMT.

In this example, on a cap layer 7 similar to that shown in FIG. 7, there were formed an In-doped n-type Al$_{0.28}$Ga$_{0.72}$As: In etching stopper layer 19, and an n-type GaAs second cap layer 20.

There were formed an E mode gate electrode 23 on the electron supply layer 6, and a D mode gate electrode 24 on the cap layer 7, by employing selectively etching at different levels. Source and drain electrodes were formed on both sides of these gate electrodes to form the E mode HEMT and D mode HEMT.

The sheet electron concentrations and mobilities of the HEMT structures described above were measured. For the comparison, a HEMT structure formed on a GaAs substrate and a HEMT structure formed on a GaAs layer on a Si substrate without the polishing process, were also measured. The growth temperature was 650° C. for all the cases. The measured results are given in Table 1.

TABLE 1

| Sample | Sheet Electron Concentration ($cm^{-2}$) | Mobility ($cm^{-2}$/Vs at LNT) |
|---|---|---|
| On GaAs Substrate | 1.0E12 | 30000 |
| Without Polishing | 0.9E12 | 18000 |
| With Polishing TEGa | 1.0E12 | 28000 |
| With Polishing TEGa + TMGa | 0.95E12 | 25000 |
| With Polishing TEGa + TMGa + In | 1.1E12 | 28500 |

As seen from the measurement results, use of the mixed gas of ethyl- and methyl-based source materials lowered the mobility slightly. However, by doping indium, the mobility was improved to the same level when the film was grown directly on a GaAs substrate. The mobility of the channel layer on a GaAs/Si substrate was remarkably improved when compared to the channel layer formed without the polishing process.

The present invention has been described in connection with a limited number of embodiments. The invention is not intended to be limited by the embodiments. For example, as the first buffer layer grown on an Si layer, AlAs may be used instead of GaAs. In this case, triethylaluminum (TEAl) may be used as the ethyl-based source material.

The growth temperature may be set to any value within the range of about 450° to 750° C. The growth pressure may be set to any value within the range of several Torr to about 500 Torr. The range from 100 to 50 Torr is optimum.

Namely, although the pressure of 100 Torr or less is preferable in order to obtain a speed of source material sufficient for making it directly reach the substrate surface, the pressure of 50 Torr or less makes carbon be easily incorporated into the grown layer.

In addition to HEMTs, various types of compound semiconductor devices having a hetero structure can be manufactured. For example, field effect transistors transporting current in the lateral direction or hetero bipolar transistors (HBT) transporting current in the vertical direction can also be manufactured.

It is apparent for those skilled in the art that various substitutions, changes, improvements, combinations, and the like are possible within the spirit and scope of the invention.

I claim:

1. A method of growing compound semiconductor crystal comprising:

a first growth step of growing a first monocrystalline group III-V compound semiconductor layer on an Si substrate:

a step of polishing said first monocrystalline group III-V compound semiconductor layer to obtain a polished surface; and a second growth step of epitaxially growing a second monocrystalline group III-V compound semiconductor layer on said polished surface by a metal organic chemical vapor deposition method, by using, as a group III source material, at least partially a source material of group III atoms bonded to ethyl radical at least at the initial stage of said second growth step, and thereafter by using, as a group III source material, at least partially a source material of group III atoms bonded to methyl radical.

2. A method of growing compound semiconductor crystal according to claim 1, wherein the gas pressure of the metal organic chemical vapor deposition is about 500 Torr or lower.

3. A method of growing compound semiconductor crystal according to claim 2, wherein the gas pressure of the metal organic chemical vapor deposition is selected from within the range from 50 to 100 Torr.

4. A method of growing compound semiconductor crystal according to claim 1, wherein said source material of group III atoms bonded to ethyl radical is triethylgallium, and said source material of group III atoms bonded to methyl radical is trimethylgallium.

5. A method of growing compound semiconductor crystal according to claim 4, wherein the thickness of said second monocrystalline group III-V compound semiconductor layer grown by using said triethylgallium is about 10 to 100 nm.

6. A method of growing compound semiconductor crystal according to claim 1, wherein said second growth step uses as the group III source material a mixed gas of said source material of group III atoms bonded to ethyl radical and group III atoms bonded to methyl radical.

7. A method of growing compound semiconductor crystal according to claim 6, wherein the gas pressure of the metal organic chemical vapor deposition is about 500 Torr or lower.

8. A method of growing compound semiconductor crystal according to claim 6, wherein said source material of group III atoms bonded to ethyl radical is triethylgallium, and said source material of group III atoms bonded to methyl radical is trimethylgallium.

9. A method of growing compound semiconductor crystal according to claim 8, wherein the mole flow ratio of said source material of group III atoms bonded to ethyl radical of said mixed gas relative to the whole flow of said group III source material, is about 0.1 or more.

10. A method of growing compound semiconductor crystal according to claim 1, wherein said source material of group III atoms bonded to ethyl radical is material selected from the group consisting of triethylgallium, triethylaluminum, and a compound of triethylgallium and triethylaluminum.

11. A method of growing compound semiconductor crystal according to claim 10, wherein the gas pressure of the metal organic chemical vapor deposition is about 500 Torr or lower.

12. A method of growing compound semiconductor crystal according to claim 1, wherein said source material of group III atoms bonded to methyl radical is material selected from the group consisting of trimethylgallium, trimethylaluminum, and a compound of trimethylgallium and trimethylaluminum.

13. A method of growing compound semiconductor crystal according to claim 12, wherein said second growth step includes a step of growing a first buffer layer of i-type GaAs by using triethylgallium as the group III source material, and a step of growing a second buffer layer of i-type AlGaAs and an active layer of i-type GaAs layer by using trimethylgallium as the group III source material.

14. A method of growing compound semiconductor crystal according to claim 13, wherein the gas pressure of the metal organic chemical vapor deposition is about 500 Torr or lower.

15. A method of growing a GaAs monocrystalline layer comprising:

a first growth step of growing a first monocrystalline GaAs layer on a Si substrate;

a step of polishing said first monocrystalline GaAs layer to obtain a polished surface;

a second growth step of epitaxially growing a second monocrystalline GaAs layer on said polished surface by a metal organic chemical vapor deposition method, by using triethylgallium as Ga source; and a third growth step of epitaxially growing a third monocrystalline layer of $Al_xIn_yGa_zAs$ ($x+y+z=1$, $0 \leq x, y, z \leq 1$) on said second monocrystalline GaAs layer by using trimethylgallium as Ga source.

16. A method of growing compound semiconductor crystal according to claim 15, wherein said first growth step includes growing an amorphous GaAs layer on the Si substrate, raising a substrate temperature, and epitaxially growing another GaAs layer.

* * * * *

UNITED STATES PATENT AND TRADEMARK OFFICE
CERTIFICATE OF CORRECTION

PATENT NO. : 5,399,522
DATED : March 21, 1995
INVENTOR(S) : Ohori

It is certified that error appears in the above-indentified patent and that said Letters Patent is hereby corrected as shown below:

Column 2, line 56, delete "invention-to" and insert --invention to--.

Column 5, line 21, delete "680°C" and insert --630°C--.

Column 5, line 37, delete "," after "C".

Column 6, line 14, delete "V/l11" and insert --V/lll--.

Column 8, line 9, delete "65°" and insert --650°--.

Signed and Sealed this

Twenty-seventh Day of June, 1995

Attest:

BRUCE LEHMAN

*Attesting Officer*     *Commissioner of Patents and Trademarks*